(12) United States Patent
Nightingale et al.

(10) Patent No.: US 6,191,594 B1
(45) Date of Patent: Feb. 20, 2001

(54) ADAPTER FOR A MEASUREMENT TEST PROBE

(75) Inventors: Mark W. Nightingale, Washougal; Marc A. Gessford, Seattle, both of WA (US); Richard J. Huard, Beaverton, OR (US)

(73) Assignee: Tektronix, Inc., Beaverton, OR (US)

( * ) Notice: Under 35 U.S.C. 154(b), the term of this patent shall be extended for 0 days.

(21) Appl. No.: 08/738,861

(22) Filed: Oct. 28, 1996

(51) Int. Cl.$^7$ .................................................. G01R 1/04
(52) U.S. Cl. .............................................. 324/754; 324/757
(58) Field of Search .................................. 324/754, 762, 324/755, 72.5, 538, 158.1, 73, 133, 757; 439/850, 638, 695, 482, 697, 692

(56) References Cited

U.S. PATENT DOCUMENTS

| | | | |
|---|---|---|---|
| 3,701,077 | * 10/1972 | Kelly, Jr. | 324/754 |
| 4,671,590 | * 6/1987 | Ignasiak | 439/266 |
| 4,721,903 | * 1/1988 | Harsch et al. | 324/754 |
| 4,749,362 | * 6/1988 | Hoffman et al. | 324/754 |
| 4,816,751 | * 3/1989 | Seiichi et al. | 324/73 |
| 4,834,677 | * 5/1989 | Archang | 439/638 |
| 4,835,469 | * 5/1989 | Jones et al. | 324/158.1 |
| 4,871,964 | * 10/1989 | Boll et al. | 324/72.5 |
| 5,033,977 | * 7/1991 | Ignasiak | 324/754 |
| 5,184,065 | * 2/1993 | Chism | 324/72.5 |
| 5,223,787 | 6/1993 | Smith et al. | 324/158 |
| 5,387,872 | * 2/1995 | Nightingale | 324/538 |
| 5,394,099 | * 2/1995 | Kazama | 324/754 |
| 5,453,700 | * 9/1995 | Balyasny | 324/755 |
| 5,463,324 | * 10/1995 | Wardwell et al. | 324/754 |
| 5,506,515 | * 4/1996 | Godshalk et al. | 324/762 |
| 5,512,838 | * 4/1996 | Roach | 324/754 |
| 5,525,812 | * 6/1996 | Bandzuch et al. | 257/48 |
| 5,548,223 | * 8/1996 | Cole et al. | 324/754 |

* cited by examiner

Primary Examiner—Vinh P. Nguyen
(74) Attorney, Agent, or Firm—William K. Bucher

(57) ABSTRACT

A probe adapter for coupling probe tip contacts of a electrical measurement probe to leads of a surface mounted integrated circuit IC device has an insulating housing from which extend first and second flexible electrically conductive leads having a pitch geometry compatible with the leads of the IC device. First and second electrical contacts, respectively coupled to the first and second flexible electrically conductive leads, are disposed in the housing and have a pitch geometry compatible with the probe tip contacts of the electrical measurement probe.

13 Claims, 6 Drawing Sheets

ADAPTER FOR A MEASUREMENT TEST PROBE

TECHNICAL FIELD

The present invention is related to probe adapters for measurement test probes and more specifically to a probe adapter for measuring electrical signals on very fine pitch geometry electronic devices.

BACKGROUND OF THE INVENTION

Surface mounted (SMT) integrated circuit devices are fast becoming the dominant type of IC packaging in the electronics industry. These devices come in a wide variety of package configurations and lead pitch geometries. For example, IC packages may be square or rectangular with electrical contact or lead counts from 44 to 232 or higher. A variety of electrical contact or lead types are also being used. Quad flat pack IC's use Gull wing leads or J-leads. Both type of leads extend from the perimeter of the IC package with the former type of leads bending down and outward from the package while the later bend down and fold under the package in a J-shape. The leads are soldered to electrical contact pads formed on a circuit board.

The small pitch geometries of the quad flat pack SMT devices makes these devices very difficult to probe using oscilloscope or logic analyzer probes. The pitch geometries or lead spacing between lead centers varies on these devices. The most commonly used lead spacings for quad flat packs are 0.5 mm, 0.65 mm, 0.8 mm, 1 mm, 0.025 inches and 0.019 inches. Work is progressing on even smaller pitch geometries in the range of 0.010 inch lead spacing. The standards for gap spacing between leads is set out in JEDEC Publication No. 95, MO-104 and varies for the various lead spacings. For example, the minimum gap spacing standard for an 0.025 inch pitch geometry is 0.010 inches and 0.008 inches for a 0.019 inch pitch geometry. Using oscilloscope probes on these types of IC packages can cause the shorting of adjacent leads of the device.

U.S. Pat. No. 5,184,065, assigned to the assignees of the present invention, describes a twist lock probe tip for use with passive measurement probes. The probe tip has a flat flexible body of insulating material with an electrical conductor embedded or coated on one or both sides of the body. The flexible body has a notch or notches for exposing the embedded electrical conductor and/or for engaging a lead of an electronic component. The flexible body is inserted between the leads of the electronic device and twisted by means of an attached knob or wing lever so that the notches engage adjacent leads and the conductor or conductors contacts the desired lead or leads. As the pitch geometries of electronic devices continue to decrease, the leads on the electronic devices become increasing fragile and susceptible to bending and damage. Further, the chance for shorting adjacent leads together by bending leads increases as the gap between leads decreases. The twist lock probe tip design has the potential for deforming the leads of the electronic device as the probe tip is twisted into position. Additionally, the probe tip becomes increasing fragile as the thickness of the tip is decreased to match the decreasing gap size of the leads, especially where the notches are added for locking the tip between the leads. Further, the thickness of the tip may exceed the leads gaps, especially where electrical conductors are formed on opposite sides of the insulating material.

U.S. Pat. No. 5,387,872, assigned to the assignees of the present invention, describes a positioning aid for directly positioning a hand-held electrical test probe onto leads of a surface mounted integrated circuit device. The positioning aid has a housing made of a polycarbonate material with a central bore therethrough for receiving the probing tip of the test probe. One end of the housing that is normal to the bore has at least four teeth extending therefrom defining slots for engaging the leads of the integrated circuit device. The central bore is exposed in the central slot for exposing the probing tip therein for providing an electrical connection between one of the leads on the integrated circuit device and electrical circuitry in the test probe.

The usefulness of this design is limited by the thickness of the teeth. For pitch geometries less than 0.019 inches, the teeth become to fragile for practical use due to the thickness of the teeth being so small. Further, this design does not lend itself for dual lead probing where adjacent IC leads are probed using a single probe. Modifying this design for such a use requires some sort of internal transition from the pitch spacing of the probe contacts to the pitch spacing of the IC leads. Such a transition is considered expensive and increase the manufacturing costs of such a device.

U.S. Pat. No. 5,506,515 describes a high-frequency probe tip assembly for low-loss microwave frequency operations. The tip assembly includes a semi-rigid coaxial cable that is formed with a semicylindrical recess defining a shelf along which an inner finger and outer pair of fingers are mounted. Each finger is made of a resilient conductive material, such as beryllium copper, so as to form a coplanar transmission line. Cantilevered portions of the fingers extend past the end of the cable to form an air-dielectric transmission path of uniform and stable characteristics. The inner finger is electrically connected to the central conductor of the semi-rigid coaxial cable and the outer pair are electrically coupled to the shield of the semirigid cable.

The probe tip is designed as part of a coaxial transmission line for probing pads of integrated circuit dies. As such, the fingers of the probe tip need to be configured in terms of material composition, cross-sectional geometry and spacial orientation to provide a uniform deflection characteristic relative to each finger for even wearing of the pads and fingers and for stability of transmission characteristics despite contact pressure variations. These requirements result in the use of rigid conductive material for the fingers. Additionally, the design does not require the use of insulating material other than the air gaps between the fingers. Further, this design does lend itself for use with standard electrical measurement probes, such as used in conjunction with oscilloscopes, logic analyzers, and the like.

What is needed is a probe adapter for electrical measurement probes that are used in conjunction with oscilloscopes, logic analyzers, and the like for probing closely spaced leads of an electronic device, such as a surface mounted integrated circuit IC. The probe adapter should have electrically conductive elements that are compatible with the pitch geometry of the IC leads and electrical contacts compatible with the pitch geometry of the measurement test probe.

SUMMARY OF THE INVENTION

Accordingly, an object of the present invention is to provide an adapter for probing fine pitch geometry integrated circuit devices.

An additional object of the present invention is to provide an adapter for a measurement test probe having multiple probing leads compatible with the pitch geometry of integrated circuit devices.

A further objective of the present invention is to provide an adapter easy to assemble and inexpensive to manufacture.

The present invention is a probe adapter for coupling probe tip contacts of an electrical measurement probe to an electronic device having multiple electrical leads directly connected to a substrate with separation between the electrical leads defining a pitch geometry. The probe adapter has first and second flexible electrically conductive leads extending from a first surface of an insulating housing. The leads are preferably formed of a flexible dielectric substrate having electrically conductive material formed on one surface of the respective substrates. Separation between the flexible electrically conductive leads is compatible with the pitch geometry of the electrical leads of the electronic device. First and second electrical contacts are disposed in a second surface of the housing and are respectively coupled to the first and second flexible electrically conductive leads. The pitch geometry of the electrical contacts are compatible with the probe tip contacts of an electrical measurement probe.

The probe adapter further includes a first insulating member disposed between the first and second flexible electrically conductive leads for establishing the separation between the leads compatible with the pitch geometry of the electrical leads of the electronic device. A second insulating member is disposed between the first and second electrical contacts for establishing the pitch geometry compatible with the probe tip contacts of the electrical measurement probe.

The housing preferably has an outer shell and inner insulating member with the inner insulating member including the first and second insulating members. The outer shell has a bore therethrough defining openings at opposing ends of the shell with one opening being sized to receive the flexible electrically conductive leads and the other opening being sized to receive the electrical contacts. The inner insulating member is conformable with the bore for securing the flexible electrically conductive leads and the electrical contacts within the housing and has a first end disposed between the first and second flexible electrically conductive leads for establishing the separation between the leads compatible with the pitch geometry of the electrical leads of the electronic device. An opposing second end of the inner insulating member is disposed between the first and second electrical contacts for establishing the pitch geometry compatible with the probe tip contacts of the electrical measurement probe.

The first and second electrical contacts are preferably electrically conductive pins extending from the second surface of the housing. Alternately, the first and second electrical contacts may be electrically conductive sleeves extending into the insulating housing.

The housing may further have a base and cover with the base having a bottom surface and opposing end surfaces defining the first and second surfaces. The first end surface includes an opening therein for receiving the flexible electrically conductive leads and the second end surface includes an opening therein for receiving the electrical contacts. The cover has a top surface and opposing side surfaces with the top and side surfaces of the cover mating with the bottom and end surfaces of the base. The first and second end surface openings may further include a rib or a wedge disposed in the respective opening defining slots through which the respective first and second flexible electrically conductive leads and the first and second electrical contacts extend. The rib or wedge may be integral with the base or cover. The wedge may also be movable within a slot formed in either the base or the cover for varying the minimum spacing between the flexible electrically conductive sleeves. The wedge may be moved laterally or laterally and rotatably in the slot. Alternately, the first end surface may have slots therein for receiving the flexible electrically conductive leads and the second end surface may have apertures therein for receiving the electrical contacts.

The probe adapter of the present invention may also include a plurality of flexible electrically conductive leads extending from one end of the housing and coupled to corresponding electrical contacts extending from the other end of the housing. The flexible electrically conductive leads have a pitch geometry compatible with the pitch geometry of the electrical leads of an electronic device and the electrical contacts have a pitch geometry compatible with the probe tip contacts of a logic analyzer type probe. The objects, advantages and novel features of the present invention are apparent from the following detailed description when read in conjunction with appended claims and attached drawings.

DETAILED DESCRIPTION OF THE PREFERRED EMBODIMENT

Figure 1:
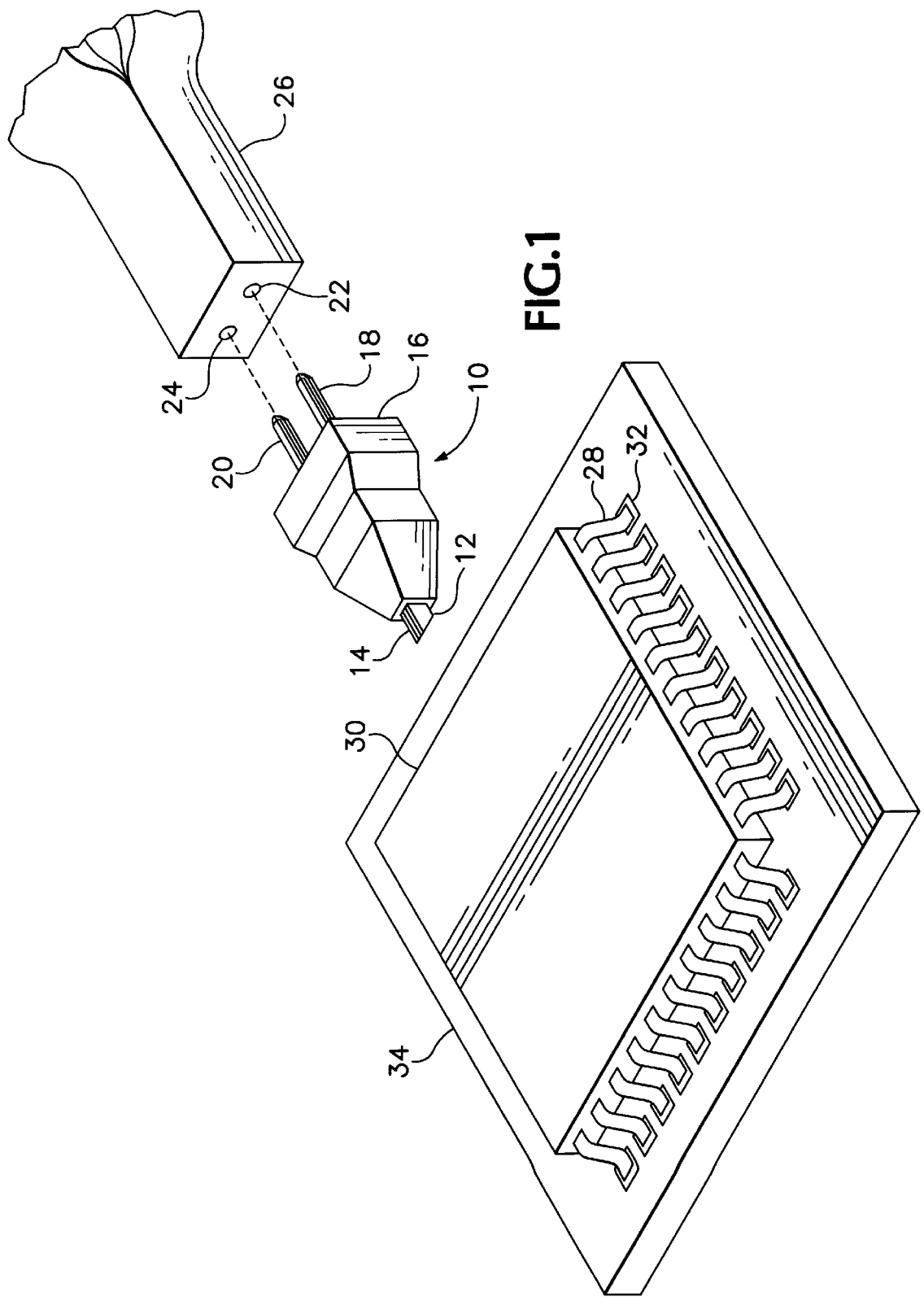
FIG. 1 is a perspective view of the probe adapter according to the present invention.

Referring to FIG. 1 there is shown a perspective view of the probe adapter 10 of the present invention. The probe adapter 10 includes flexible electrically conductive leads 12 and 14 that extend from one end of an insulating housing 16. In the preferred embodiment, the flexible electrically conductive leads 12 and 14 extend from the housing in a range of about 0.080 inches. Extending from the opposite end of the housing 16 are electrical contacts 18 and 20, which are coupled to probe tip contacts 22 and 24 of an electrical measurement probe 26. The probe tip contacts 22 and 24 may be electrically conductive sleeves that are coupled to electrical circuity within the probe 26. Alternately, the probe tip contacts 22 and 24 may be probing tips extending from the probe 26 that mate with the electrical contact sleeves to be described later. The probe tip contacts 22 and 24 may be inputs of a differential measurement test probe. Alternately, one probe tip contact may be signal conductor while the other is ground conductor.

Each conductive lead 12, 14 is insulated on one side and has electrically conductive material on the other. The electrically conductive material on the leads 12 and 14 are preferably disposed in the same direction. The conductive leads 12 and 14 are positioned between electrical leads 28 on an electronic device 30, such as a quad flat pack integrated circuit, IC, having gull wing leads or J-leads. The pitch geometry or lead spacing between the leads 28 may range 0.5 mm or about 0.019 inches to 1 mm or about 0.04 inches. Current development is underway for IC packages having 0.25 mm or 0.01 inches lead spacing. The leads 28 of the electronic device 30 are connected to electrical contact pads 32 formed on a substrate 34, such as a circuit board or the like.

Figure 2:
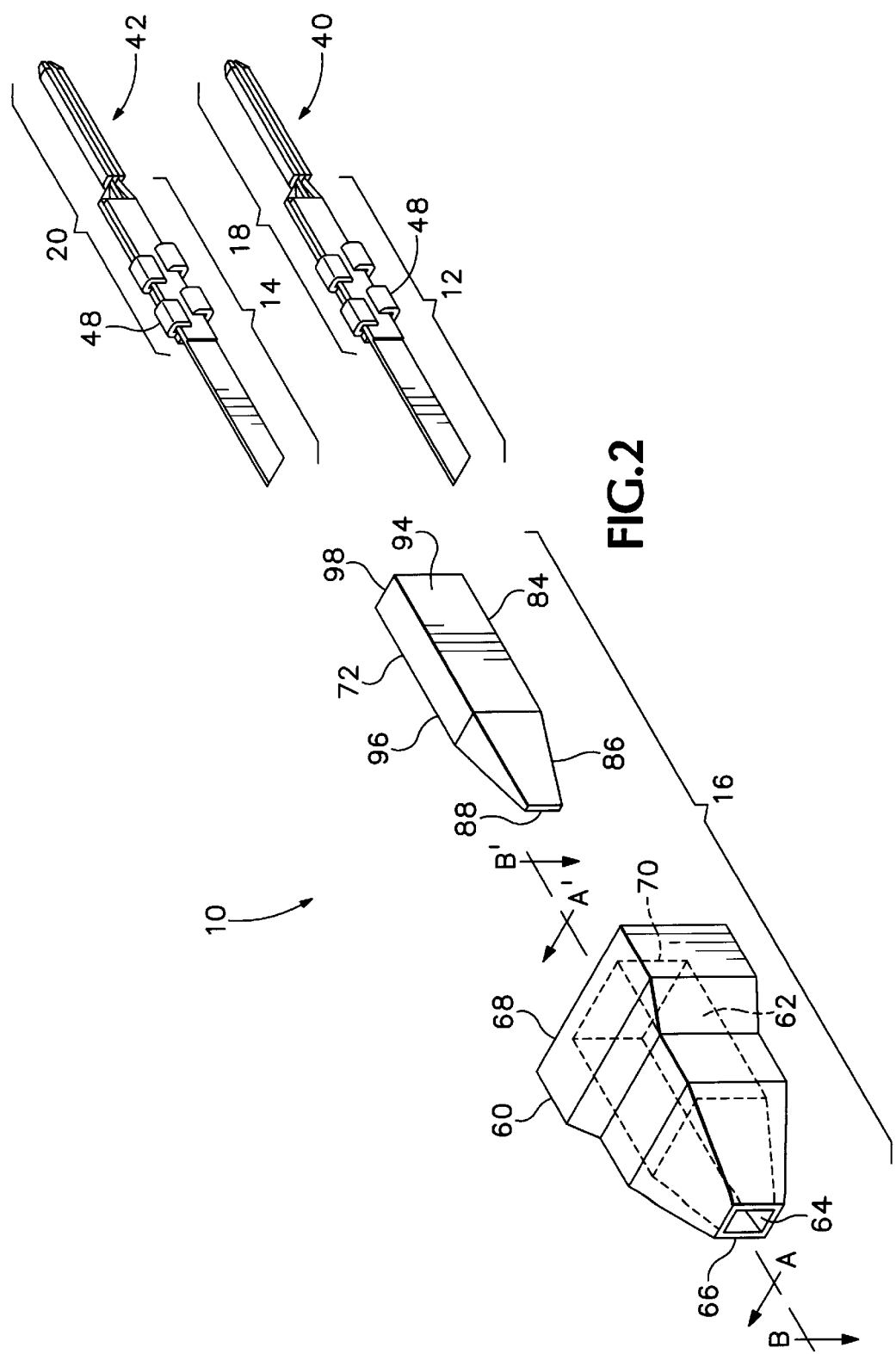
FIG. 2 is an exploded perspective view of the probe adapter according to the present invention.
Figure 3A:
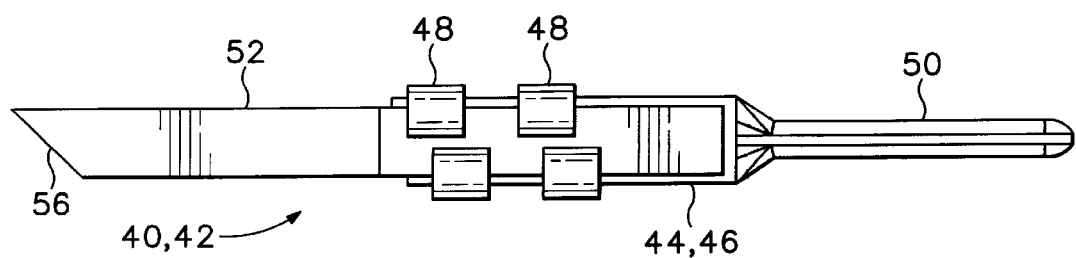
FIG. 3A is a side view of the flexible electrically conductive lead and electrical contact assembly of the probe adapter according to the present invention.
Figure 3B:
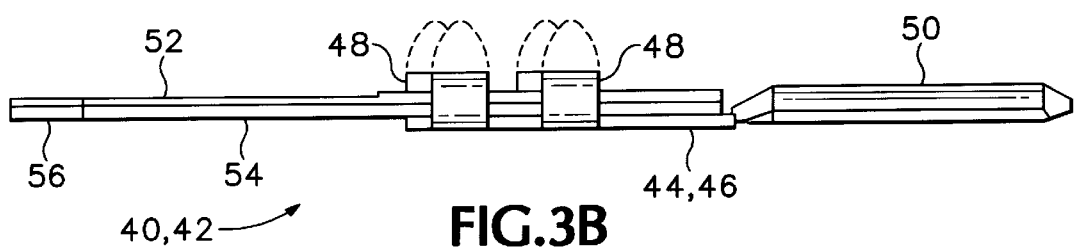
FIG. 3B is a top view of the flexible electrically conductive lead and electrical contact assembly in the probe adapter according to the present invention.
Figure 3C:
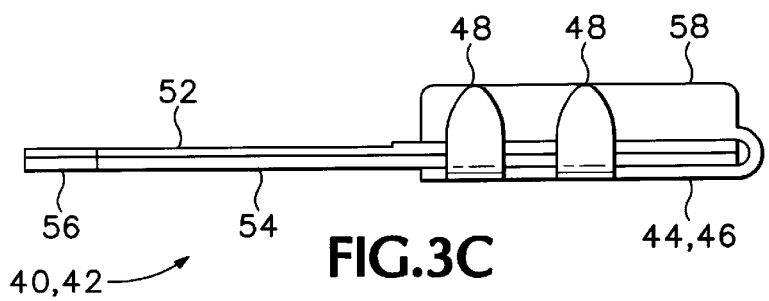
FIG. 3C is a side view of an alternative flexible electrically conductive lead and electrical sleeve contact assembly of the probe adapter according to the present invention.

Referring to FIG. 2, there is shown an exploded perspective view of the preferred embodiment of the probe adapter 10 of the present invention. The flexible electrically conductive leads 12 and 14 are electrically coupled to the respective electrical contacts 18 and 20 forming assemblies 40 and 42. The electrical contacts 18 and 20 have respective flat portions 44 and 46, as shown in FIGS. 3A and 3B, with tapered fingers 48 extending upward on opposite sides of the flat portions 44, 46. Extending from one end of the respective flat portions 44, 46 are square pins 50. Leads 12 and 14 are formed of a flexible dielectric substrate 52, such as polyamide or the like, with electrically conductive material 54, such as tin plated copper or the like, deposited on one of the flat surfaces of the substrate 52. The ends 56 of the leads 12 and 14 are preferably angled for making insertion between the leads 28 of the electronic device 30 easier. The other ends of the leads 12 and 14 are placed on the respective flat portions 44, 46 of the electrical contacts 18 and 20 with the electrically conductive material 54 in contact the flat portions 44, 46. The tapered finger 48 on the respective electrical contacts 18 and 20 are folded over and crimped against the leads 12 and 14 to electrically couple and physically secure the leads 12 and 14 to contacts 18 and 20. Alternately, the leads 12 and 14 may be electrically coupled and secured to the contacts 18 and 20 using electrically conductive adhesive, solder, rivets, or any other securing means that provides good electrical contact and a strong physical connection between the leads 12 and 14 and the contacts 18 and 20. With such alternative securing means it may not be necessary to have the tapered fingers 48 on the flat portions 44, 46 of the electrical contacts 18 and 20. Further, the square pins 50 may be replaced with conductive sleeves 58, shown in FIG. 3C, which extend over at least part of the flat portion 44, 46 of the electrical contacts 18 and 20. One possible configuration for the sleeve type electrical contact is to have one end of the sleeves 58 being physically connected to the end of the flat portions 44, 46 and the sleeves 58 folded back over the flat portions 44, 46 at the connection. The flexible electrically conductive leads 12 or 14 are placed between the flat portions 44, 46 and the sleeves 58 and the tapered fingers 48 are crimped against the sleeves 58 securing the lead 12 or 14 between the flat portions 44, 46 and the sleeves 58.

The insulating housing 16 includes an outer shell 60 having a bore 62 therethrough for receiving assemblies 40 and 42. The outer shell 60 and the bore 62 are tapered to produce an opening 64 on one surface 66 of the outer shell 60 from which the flexible electrically conductive leads 12 and 14 extend. The opening 64 establishes the maximum separation between the leads 12 and 14. The opposing surface 68 of the outer shell 60 has an opening 70 in which the electrical contacts 18 and 20 are disposed. Opening 70 establishes the maximum separation between the contacts 18 and 20. An inner insulating member 72 is disposed within the bore 62 between the assemblies 40 and 42. The inner insulating member 72 is tapered to conform to the taper of the bore 62. The inner insulating member 72 secures the flexible electrically conductive lead and electrical contact assemblies 40 and 42 and establishes the minimum separation or pitch geometry between the leads 12 and 14 and the contacts 18 and 20. In the preferred embodiment, the spacing between flexible lead 12 and 14 centers extending from the insulating housing 60 is in the range of about 0.0225 inches producing a gap between the leads 12 and 14 of 0.0145 inches. This allows probing of the leads 28 of IC devices 30 having either 0.019 inch center or 0.025 inch centers in that the flexible leads may be bent to conform to the particular lead spacing. This is a particular advantage of using the flexible electrically conductive lead design. Further, the present invention allows the minimum spacing between the flexible electrically conductive leads 12 and 14 to be decreased as the lead spacing or pitch geometry of IC devices 30 decrease as for example in IC devices having 0.010 pitch geometry. This flexibility in lead spacing also carries over to the spacing of the electrical contacts 18 and 20. As lead spacing on IC devices decreases, it may be necessary to decrease the size of the measurement test probe for performing measurements on these devices. The probe adapter 10 of the present invention may be easily configured for smaller probe designs.

With continued reference to FIGS. 3A and 3B, the overall length of the each assembly 40 and 42 is in the range of about 0.778 inches with the overall length of the flexible electrically conductive leads 12 and 14 being in the range of about 0.520 inches and the electrical contacts 18 and 20 being in the range of about 0.475 inches. The width of the leads 12 and 14 is in the range of about 0.050 inches and the thickness, including the electrically conductive material 54, is in the range of 0.004 to 0.010 inches with the preferred thickness being about 0.008 inches. The thickness of the electrically conductive material is in the range of about 0.001 to 0.003 inches. An example of the flexible dielectric substrate 52 having electrically conductive material 54 deposited on one of the surfaces is flexible flat conductor cable, manufactured and sold by Amp, Inc., Harrisburg, Pa. under Part No. 88586-9. Another example of the flexible dielectric substrate 52 is a polyamide substrate having copper electrically conductive material deposited on one side as may be provided by Merix, Corp., Forest Grove, Oreg. One end 56 of the electrical leads is angled, preferably in a range of about 45°.

The flat portion 44, 46 of the respective electrical contacts 18 and 20 has a length in the range of 0.250 inches, a width in the range of 0.072 inches, and a thickness in the range of 0.0099 inches. The height of the tapered fingers 48 before they are folded over is in the range of about 0.090 inches. The overall thickness of the electrical contacts 18 and 20 after the tapered fingers 48 are crimped is in the range of about 0.037 inches. The square pin 50 extending from the flat portion 44, 46 has an overall length in the range of 0.225 inches and width and height dimensions in the range of 0.025 inches. The electrical contacts are made of a phosphor bronze alloy with a 0.000015 thick underplating of nickel. Localized areas, such as on the square pins 50, are plated with a 0.000015 layer of gold and the rest of the contact is plated with a 0.000100 layer of tin-lead. The above described electrical contact is manufactured and sold by AMP, Inc. Harrisburg, Pa. under Part No. 88976-2. Other types of electrical contacts having similar dimensions may be used in implementing this invention.

Figure 4A:
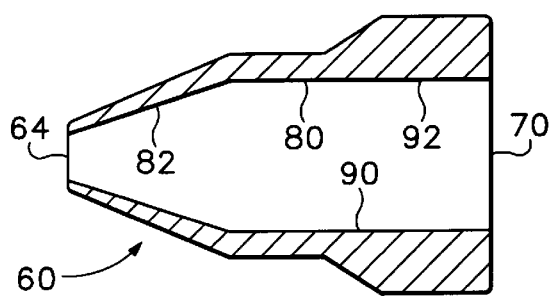
FIG. 4A is a horizontal cross-sectional view along sectional line A–A' of the housing in the probe adapter according to the present invention.
Figure 4B:
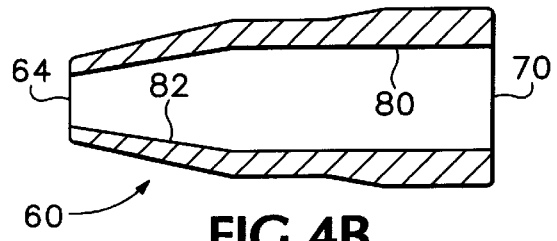
FIG. 4B is a vertical cross-sectional view along sectional line B–B' of the housing in the probe adapter according to the present invention.

Referring to the respective horizontal and vertical cross-sectional views of the outer shell 60 in FIGS. 4A and 4B, the outer shell 60 has an overall length in the range of about 0.400 inches with a width at wide end or opening 70 in the range of about 0.260 inches tapering to a width in the range of about 0.053 inches at the narrow end or opening 64. The height of the housing at the wide end is in the range of about 0.166 inches tapering to a height in the range of about 0.072 inches at the narrow or lead end 64. The width and height of the bore 62 at the wide end of the outer shell 60 are respectively in the ranges of about 0.140 inches and about 0.100 inches. The bore 62 tapers to lead end 64 of the outer shell 60 and has a width in the range of about 0.0305 inches and a height in the range of about 0.050 inches. In the preferred embodiment, the bore 62 has a rectangular section 80 having a length in the range of about 0.250 inches transitioning into a tapered section 82 having a length in the range of about 0.150 inches.

The inner insulating member 72 is conformable with the bore 62 for securing the assemblies 40 and 42 within the housing. The inner insulating member 72 has an overall length in the range of about 0.400 inches with a rectangular portion 84 having a length in the range of about 0.250 inches and a tapered portion 86 having a length in the range of about 0.150 inches. The rectangular portion 84 has a width in the range of about 0.100 inches and a height in the range of about 0.100 inches. The tapered portion 86 tapers from the 0.100 inch width and height dimensions at one end to a width in the range of about 0.0145 inches and a height in the range of about 0.050 inches at the other end 88.

The outer shell 60 and the inner insulating member 72 are preferably injected molded parts made of ABS plastic or similar type of insulating material, Alternately, the outer shell 60 and inner insulating member may be made of a polycarbonate material.

One or both of the inner side walls 90 and 92, adjacent to the bore 62, may include notches or grooves for receiving the crimped fingers 48 of the electrical contacts 18 and 20. Alternately, notches and grooves may be formed in one or both side surfaces 94 and 96 of the inner insulating member 72 for receiving the crimped fingers 48. As shown in FIG. 2, the crimped fingers 48 of assemblies 40 and 42 are disposed in the same direction. In this configuration, one inner sidewall 90 of the shell and one of the inner surfaces 96 of the insulating member 72 will have the notches or grooves. In a configuration where the assemblies 40 and 42 are formed with the crimped fingers 48 disposed outwardly, the notches or grooved would be formed in the both of the inner sidewalls 90 and 92 of the shell 60. In a configuration where the assemblies 40 and 42 are formed with the crimped fingers 48 facing each other, the notches or grooves would be formed in both inner surfaces 94 and 96 of the insulating member 72. In the configuration where the square pins 50 are replaced with sleeves 58, grooves may be formed in either or both the inner sidewalls 90 and 92 of the shell 60 and the side surfaces 94 and 96 of the insulating member 72 for receiving the sleeve contact.

The probe adapter 10 is assembled by inserting the assemblies 40 and 42 into the bore 62 in the outer shell 60 with the angled ends 56 of the flexible electrically conductive leads 12 and 14 extending out of the opening 64 on the surface 66 of the outer shell 60. The inner insulating member 72 is inserted into the bore 62 at the opening 70 on the opposing surface 68 of the shell 60 with the inner insulating member 72 being disposed between the assemblies 40 and 42. The tapered end 88 of the inner insulating member 72 extends to the opening 64 in the outer shell 60 and the opposing other end 98 of the inner insulating member 72 extends to the opening 70 in the shell 60. The inner insulating member 72 conforms to the dimensions of the bore 62 in height and the bore 62 and the assemblies 40 and 42 in width for securing the flexible electrically conductive leads 12 and 14 and the electrical contacts 18 and 20 of assemblies 40 and 42 in the housing. The assemblies 40 and 42 are captured between the side surfaces 94 and 96 of inner insulating member 72 and the inner sidewalls 90 and 92 of the outer shell 60. The inner insulating member 72 may be secured in the outer shell 60 by any number of alternative methods. For example, the insulating member 72 may be secured within the bore 62 by frictional force, gluing, sonic welding, or tabs and notches in the shell 60 and insulating member 72 for snap fitting the parts together.

Figure 5A:
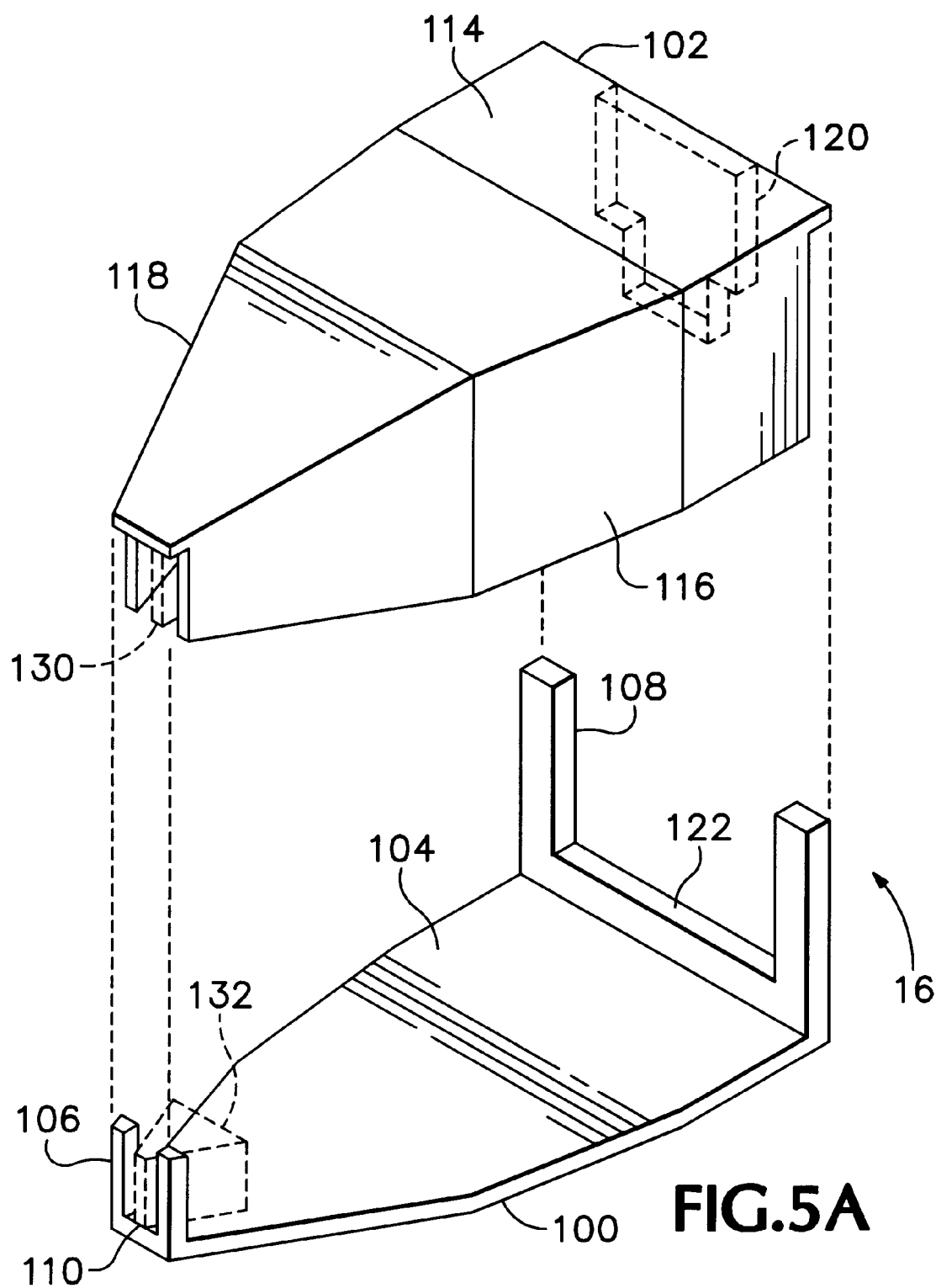
FIG. 5A is an exploded perspective view a first an alternative housing of the probe adapter according to the present invention.

Referring to FIG. 5A, the is shown an alternative housing 16 for the probe adapter 10. The housing 16 includes a base 100 and cover 102. The base 100 has a bottom surface 104 and opposing end surfaces 106 and 108. End surface 106 has an opening 110 therein for receiving the flexible electrically conductive leads 12 and 14 of assemblies 40 and 42. The end surface 108 has an opening 112 for receiving the electrical contacts 18 and 20 of assemblies 40 and 42. The cover 102 has a top surface 114 and opposing side surfaces 116 and 118. The top surface 114 and side surfaces 116 and 118 of the cover 102 mate with the end surfaces 106 and 108 and the bottom surface 104 of the base 100. The overall dimensions of the alternative housing conform to the dimensions of the previously described housing formed of the outer shell 60 and inner insulating member 72. Specifically, the width of the opening 110 is in the range of 0.0305 inches and the height is in the range of 0.050 inches. The opening 112 may vary depending on the configuration. For example, the cover 102 may include a rib 120 extending from the end of the cover having approximately 0.025 inches square notches formed in the lower corners. The width of the upper portion of the rib 120 is approximately 0.125 inches. The width of the opening 112 would be the same approximate 0.125 inch width of the upper portion of the rib 120. The height of the opening would be in the range of about 0.0705 inches, which would center the electrical contacts 18 and 20 in the end surface of the housing. The height of the rib 120 would be in the range of about 0.0955 inches, which when combined with the height of the opening produces a overall height in the range of 0.166 inches matching that of the previously described housing. This configuration for the opening 112 and the rib 120 establishes a center to center spacing between the electrical contacts of 0.100 inches.

Figure 5B:
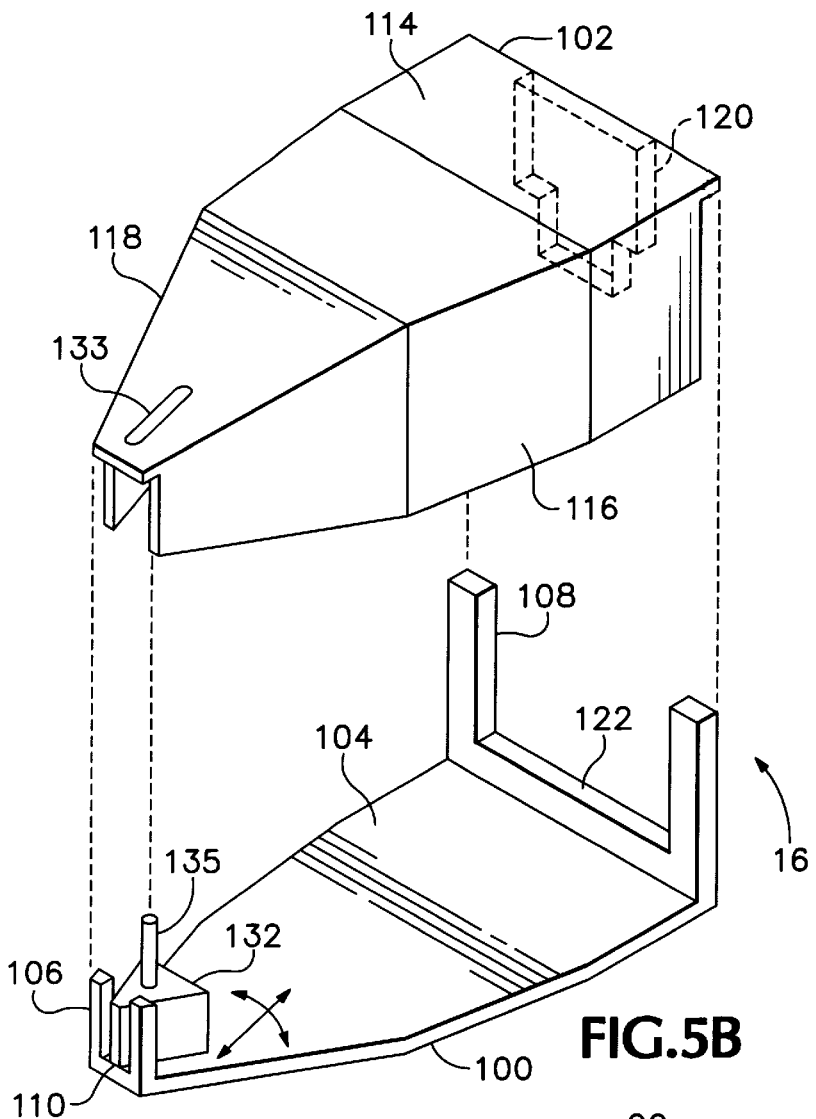
FIG. 5B is an exploded perspective view of a second alternative housing of the probe adapter according to the present invention.
Figure 6:
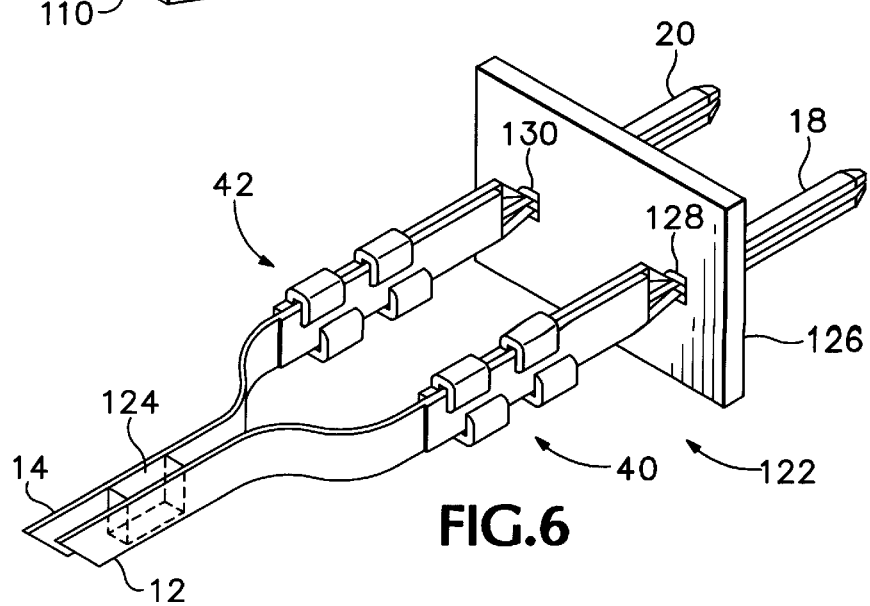
FIG. 6 is a perspective view of an alternative spacing configuration for the flexible electrically conductive lead and electrical contact assemblies in the probe adapter according to the present invention.

FIG. 6 shows an alterative spacing configuration 122 for the flexible electrically conductive leads 12 and 14 and the electrical contacts 18 and 20 usable in the housing shown in FIG. 5. The flexible electrically conductive leads 12 and 14 and the electrical contacts 18 and 20 for assemblies 40 and 42 are the same as previous described. An insulating member 124 is disposed between the leads 12 and 14 that establishes a lead spacing compatible with the electrical leads 28 of the IC 30. As previously described, the preferred width of insulating member 124 is in the range of about 0.0145 inches producing a center to center spacing between the leads 12 and 14 of about 0.0225 inches. The electrical contacts 18 and 20 are disposed in another insulating member 126 having rectangular apertures 128 and 130 formed therein for receiving the contacts 18 and 20. The distance between the centers of the apertures 128 and 130 is 0.100 inches for establishing the proper spacing between the contacts 18 and 20. The overall length and width of the insulating member 126 may vary depending on the size of the opening 112 in the base 100 of the housing 16. A representative length would be in the range of about 0.160 inches and a width would be in the range of about 0.100 inches.

The alternative spacing arrangement 122 is usable with the housing 16 shown in FIG. 5A. The insulating member 126 is secured in the opening 112 using an adhesive or other appropriate fastening means, such as snap fit. The flexible electrically conductive leads 12 and 14 extend from the opening 110 with the insulating member 124 providing the minimum spacing between leads 12 and 14. Additional ribs or the like, not shown in FIG. 5A, may be included in the base 104 for guiding the flexible contacts 12 and 14 within the housing and to prevent the leads 12 and 14 from extending too far out of the opening 110.

FIGS. 5A and 5B also shows modifications to the housing 16 which may be used with a modified alternative spacing arrangement 122. In FIG. 5A, the housing has a rib 131 extending down from the cover 102 into the opening 110. The rib 131 has a width that defines the minimum separation between leads 12 and 14. The rib 131 replaces the insulating member 124 in the spacing arrangement 122. FIG. 5B also show an approximate triangular wedge 132 formed on the base 100 at the opening 110. The triangular wedge 132 tapers from the base of the triangle to the apex which has width defining the minimum spacing between leads 12 and 14. The triangular wedge 132 replaces the insulating member 124 in the alternative spacing arrangement 122. With any of these arrangements it is possible to switch the position of the elements, such as the rib 131, wedge 132, the opening 112 and the like from the base 100 to the cover 102. For example, the wedge insulating member 132 may be disposed from the cover 102. Further, a 133 slot having detents therein may be formed in the cover that receives a rod 135 attached to the wedge 132. The wedge 132 may then be moved into and out of the opening 110 to increase or decrease the minimum spacing between the leads 12 and 14. A further configuration is to have the wedge 132 rotatable within the housing 16 about the rod. The corners of the wedge 132 could have different thicknesses defining different minimum separations between leads 12 and 14. The wedge 132 is moved away from the opening 112 using the rod 135 attached to the wedge 132 disposed in the slot 133 in the cover 102. The wedge 132 is rotated to bring the selected corner into alignment with the opening 112. The wedge 132 is moved back into alignment with the opening 112 bringing the selected apex of the wedge 132 into the opening 112.

Figure 7:
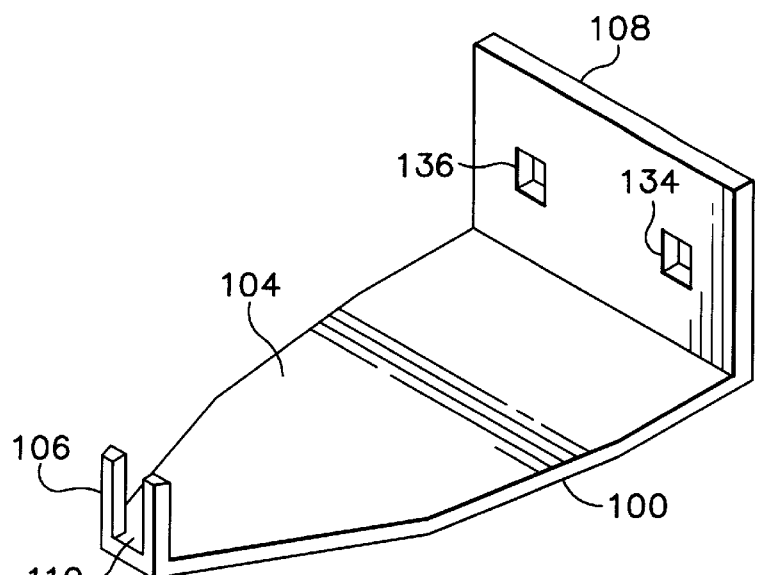
FIG. 7 is a perspective view of an alternative base in the alternative housing of the probe adapter according to the present invention.

FIG. 7 shows a further modification to the base 100 usable in housing 16. Like elements of the base in FIGS. 5A and 5B are the same in FIG. 7. The base 100 has a bottom surface 104 and opposing end surfaces 106 and 108. End surface 106 has an opening 110 therein for receiving the flexible electrically conductive leads 12 and 14 of assemblies 40 and 42. The end surface 108 has rectangular apertures 134 and 136 for receiving the electrical contacts 18 and 20 of assemblies 40 and 42. The alternative spacing arrangement 122 can be modified where the insulating member 126 is replaced with the end surface 108 having the apertures 134 and 136. The square pins 50 are inserted through the apertures 134 and 136 and the leads 12 and 14 with the insulating member 124 are inserted through opening 110. Even in this configuration, the insulating member may be replaced with the rib 130 or wedge 132 shown in FIGS. 5A and 5B.

Figure 8:
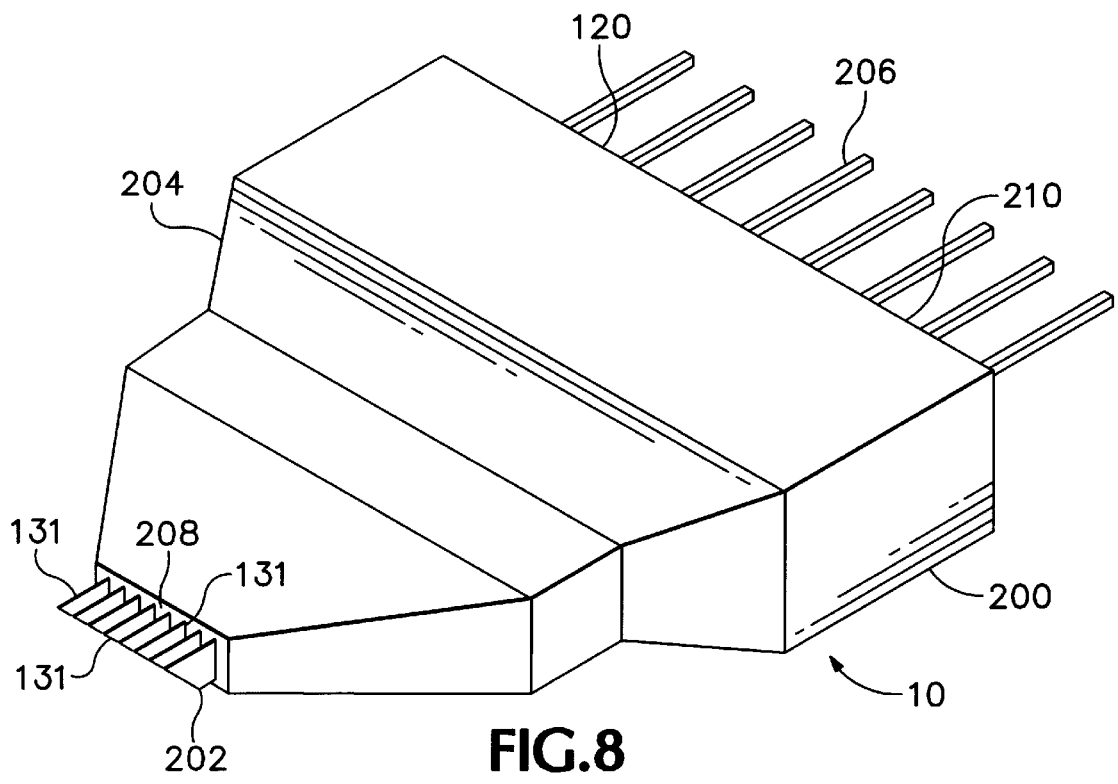
FIG. 8 is a perspective view of the probe adapter according to the present invention usable for logic analyzer probing applications.

Referring to FIG. 8, there is shown a further modification of the probe adapter 10 of the present invention. The modified probe adapter 200 is usable for logic analyzer applications where signals are simultaneously taken off of a number of leads 28 on the electronic device 30. A plurality of flexible electrically conductive leads 202, similar to leads 12 and 14, extend from one end of housing 204. Extending from the opposite end of the housing 204 are a plurality of electrical contacts 206 that are respectively coupled to corresponding leads 202 in a manner previously described for assemblies 40 and 42. The housing 204 may be formed in a manner previously described for the dual lead adapter 10. The electrical contacts 206 may be plugged into sockets inputs of a high-speed, low profile logic analyzer probe described in U.S. Pat. No. 5,223,787, assigned to the assignees of the present invention. The logic analyzer probes may be individually placed on the electrical contacts 206 or the probes may be ganged together as described in the '787 patent.

The overall length of the outer flexible electrically conductive leads 202 will be longer than the leads 202 in the center due to the tapering of the housing 204 from the approximate 0.100 center pitch geometry for the electrical contacts 206 compatible with the pitch geometry of the logic analyzer probes to the approximate 0.0225 pitch geometry compatible with the pitch geometry of the leads 28 of the electronic device 30. The housing 204 may include a base and cover similar to the base and cover 104 and 102 with opening 208 and 210 for respectively receiving the leads 202 and the contacts 206. The base 102 may include ribs extending from the openings 208 and 210 defining channels for receiving the assemblies 40, 42 made of the flexible electrically conductive leads 202 and the electrical contacts 206. The ribs at the opening 208 have a thickness defining the minimum separation between the leads 202. The ribs at opening 208 may be used to define the lead spacing of the electrical contacts 206. The alternative spacing arrangement shown in FIG. 6 may also be used in the probe adapter of FIG. 8. Additional insulating members 124 are provided between the adjacent leads 202 and the insulating member 126 has additional apertures 128, 130 therein for receiving the electrical contacts 206. The housing 204 would have a configuration similar to that of the housing in FIG. 5.

The probe adapter 10 has been shown and described with flexible electrically conductive leads 12 and 14 extending from one surface of a housing 16 and electrical contacts 18 and 20 extending from a second and opposing surface. The present invention is not limited to this sole configuration and other configuration are possible within the scope of the accompanying claims. For example, the leads 12 and 14 may extend in a direction that is not parallel with the contacts 18 and 20. The leads 12 and 14 or the contacts 18 and 20 may be angled and extend from the top or bottom of the housing 16. In such a configuration, the connection between the leads 12 and 14 and the contacts 18 and 20 would be modified to the configuration.

A probe adapter 10 has been described for use with a measurement test probe having a first and second flexible electrically conductive leads 12 and 14 extending from a first surface 66 of an insulating housing 16 and having a separation between the leads 12 and 14 compatible with the pitch geometry of electrical leads 28 of an electronic device 30. First and second electrical contacts 18 and 20 are disposed in a second surface 68 of the housing 16 and are respectively coupled to the leads 12 and 14 with the contacts 18 and 20 having a pitch geometry compatible with probe tip contacts 22 and 24 of the measurement test probe 26. A number of configurations for the housing 16 and shown and described including an outer shell 60 and insulating member 72 and a base 100 and cover 102 arrangement. A number of configurations for the insulating member 72 are shown and described including an insulating wedge conformable with a bore 62 in the outer shell 60, respective insulating members 124 and 126 secured between the leads 12 and 14 and the electrical contacts 18 and 20, a rib 131 or wedge 132 formed on the base 100 or cover 102, and apertures formed through the surface 112 of the base 100. The wedge 132 may be attached to a rod 135 disposed through a slot 133 in the cover 102 permitting longitudinal or rotational movement of the wedge 132 for varying the minimum separation between the leads 12 and 14. The probe adapter 10 may also be configured with a plurality of flexible electrically conductive leads 202 and electrical contacts 206 for use in logic analyzer probing applications. These and other aspects of the present invention are set forth in the appended claims.

What is claimed is:

1. A probe adapter for coupling probe tip contacts of a hand held electrical measurement probe to an electronic device having multiple electrical leads directly connected to a substrate with separation between the electrical leads defining a pitch geometry comprising:

first and second assemblies with each assembly having a flexible electrically conductive lead formed of a planar flexible dielectric substrate having electrically conductive material formed on one surface of the substrate and coupled to an electrical contact with the flexible electrically conductive leads being selectively positionable on a subset of the multiple electrical leads of the electronic device and the electrical contacts engaging the probe tip contacts of the hand held electrical measurement probe for mounting the probe adapter onto the hand held electrical measurement probe;

an insulating member disposed between the assemblies for establishing a separation between the flexible electrically conductive leads compatible with the pitch geometry of the electrical leads of the electronic device and for establishing a pitch geometry compatible with the probe tip contacts of the hand held electrical measurement probe; and an insulated housing tapering from a first end surface to a second end surface with the first end surface having an opening therein for receiving the electrical contacts and the second end surface having an opening therein through which the flexible electrically conductive leads extend outward from the housing.

2. The probe adapter as recited in claim 1 further comprising additional assemblies and insulating members disposed in line with the first and second assemblies with the additional assemblies being adjacent to each other and having one each of the additional insulating members being disposed between each of the adjacent assemblies.

3. The probe adapter as recited in claim 1 wherein the housing comprises an outer shell having a bore therethrough defining the openings in the first and second end surfaces of the housing with the opening in the second end surface being sized to receive the flexible electrically conductive leads and the opening in the first end surface being sized to receive the electrical contacts and the insulating member being disposed in the bore and conformable with the bore and the assemblies within the bore for securing the flexible electrically conductive leads and the electrical contacts within the housing.

4. The probe adapter as recited in claim 3 wherein the insulating member further comprises a first end disposed between the flexible electrically conductive leads for establishing the separation between the leads compatible with the pitch geometry of the electrical leads of the electronic device and an opposing second end disposed between the electrical contacts for establishing the pitch geometry compatible with the probe tip contacts of the hand held electrical measurement probe.

5. The probe adapter as recited in claim 1 wherein the housing comprises a base and cover with the base having a bottom surface and opposing end surfaces defining the first and second end surfaces and the cover having a top surface and opposing side surfaces with the top and side surfaces of cover mating with the bottom and end surfaces of the base.

6. The probe adapter as recited in claim 5 wherein the insulating member comprises a first rib disposed in the second end surface opening and extending from either the base or the cover that defines slots through which the flexible electrically conductive leads extend and a second rib disposed in the first end surface opening and extending from either the base or the cover that defines slots containing the electrical contacts.

7. The probe adapter as recited in claim 5 wherein the insulating member comprises an approximate triangular shaped wedge extending from either the base or the cover with the wedge having an apex disposed in the second end surface opening that defines slots through which the flexible electrically conductive leads extend and a rib disposed in the first end surface opening and extending from either the base or the cover that defines slots containing the electrical contacts.

8. The probe adapter as recited in claim 7 wherein the cover or the base has a slot formed therein having detents for receiving a rod attached to the triangular shaped wedge for varying the position of the wedge apex relative to the second end surface opening for establishing the minimum separation between the leads.

9. The probe adapter as recited in claim 8 wherein the wedge is movable laterally in the slot.

10. The probe adapter as recited in claim 8 wherein the wedge is movable both laterally and rotationally in the slot.

11. The probe adapter as recited in claim 1 wherein the housing comprises a base and cover with the base having a bottom surface and opposing end surfaces defining the first and second end surfaces with the first end surface having slots therein for receiving the flexible electrically conductive leads and the second end surface having apertures therein for receiving the electrical contacts and the cover having a top surface opposing side surfaces with the top and side surfaces of cover mating with the bottom and end surfaces of the base.

12. The probe adapter as recited in claim 1 wherein the first and second electrical contacts comprise electrically conductive pins extending from the second surface of the housing.

13. The probe adapter as recited in claim 1 wherein the first and second electrical contacts comprise electrically conductive sleeves extending into the insulated housing.

* * * * *